US012777945B2

(12) United States Patent
Meisner et al.

(10) Patent No.: US 12,777,945 B2
(45) Date of Patent: Oct. 27, 2026

(54) INTEGRATED CIRCUIT HAVING IMPROVED ASML ALIGNMENT MARKS

(71) Applicant: TEXAS INSTRUMENTS INCORPORATED, Dallas, TX (US)

(72) Inventors: Stephen Arlon Meisner, Allen, TX (US); James Thomas Hallowell, Frisco, TX (US); Michael Todd Wyant, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 747 days.

(21) Appl. No.: 17/514,313

(22) Filed: Oct. 29, 2021

(65) Prior Publication Data

US 2023/0134102 A1 May 4, 2023

(51) Int. Cl.

| | |
|---|---|
| ***H10W 46/00*** | (2026.01) |
| ***H10W 74/10*** | (2026.01) |
| *H10P 54/00* | (2026.01) |
| *H10P 72/70* | (2026.01) |

(52) U.S. Cl.

CPC ......... *H10W 46/00* (2026.01); *H10W 74/147* (2026.01); *H10P 54/00* (2026.01); *H10P 72/7402* (2026.01); *H10P 72/742* (2026.01); *H10W 46/301* (2026.01); *H10W 46/603* (2026.01)

(58) Field of Classification Search

CPC .. H01L 23/544; H01L 21/6836; H10W 46/00; H10W 74/147; H10W 46/301; H10W 46/603; H10P 54/00; H10P 72/7402; H10P 72/742

See application file for complete search history.

(56) References Cited

U.S. PATENT DOCUMENTS 7,387,950 B1 * 6/2008 Kuo ...................... H01L 23/544
438/114

* cited by examiner

*Primary Examiner* — Britt Hanley
*Assistant Examiner* — Victor V Barzykin
(74) *Attorney, Agent, or Firm* — Ronald O. Neerings; Charles F. Koch

(57) ABSTRACT

A photo alignment structure is provided that includes a wafer having scribe lines defined therein in a top planar surface of the wafer. An alignment structure is disposed on a top planar surface of the wafer longitudinally aligned with a portion of selected scribe lines, where the alignment structure is comprised of metal layers. A slot is defined along a longitudinal axis of the alignment structure in at least one of the metal layers.

12 Claims, 13 Drawing Sheets

INTEGRATED CIRCUIT HAVING IMPROVED ASML ALIGNMENT MARKS

TECHNICAL FIELD

The present disclosure relates generally to integrated circuits, and more specifically to an integrated circuit having an improved ASML alignment mark design.

BACKGROUND

During a formation of a die or chip in an integrated circuit (IC) package, an array of dies mounted to a wafer (e.g., silicon) undergo a singulation process to separate the dies from each other for further processing or assembly. Alignment marks are attached (defined) along selected scribe marks on the wafer during the fabrication process. The alignment marks are important components in the fabrication of the wafer and the dies because the wafers and the dies are fabricated by aligning many intricate layers of conductors and insulators, one upon the other, on the wafer. It is critical that each layer precisely aligns with the previous layer so that the circuits formed in the dies are functional and reliable. During the singulation process, however, the alignment marks create separation issues between adjacent dies.

SUMMARY

In described examples, a method of fabricating an electronic device is provided that includes providing a wafer having scribe lines defined therein and depositing an alignment structure having a plurality of metal layers on a top planar surface of the wafer longitudinally aligned with a portion of selected scribe lines. A slot is etched along a longitudinal axis of the alignment structure in at least one of the plurality of metal layers of the alignment structure along the portion of the selected scribe lines.

In another described example, a method of fabricating a photo alignment structure is provided that includes providing a wafer having scribe lines defined therein and depositing a first metal layer of an alignment structure on a top surface of the wafer, the first metal layer being disposed over a portion of selected scribe lines. A second metal layer is deposited on the first metal layer, the second metal layer comprising a dielectric layer having vias defined therein, the vias filled with a metal. A third metal layer is deposited on the second metal layer. A slot is etched in a longitudinal direction of one of the first metal layer, the second metal layer, and the third metal layer along the portion of the selected scribe lines.

In another described example, a photo alignment structure is provided that includes a wafer having scribe lines defined therein in a top planar surface of the wafer. An alignment structure is disposed on a top planar surface of the wafer longitudinally aligned with a portion of selected scribe lines, the alignment structure having a plurality of metal layers. A slot is defined along a longitudinal axis of the alignment structure in at least one of the plurality of metal layers.

DETAILED DESCRIPTION

Disclosed herein is an example apparatus and method of forming an electronic device (e.g., photo alignment structure) of an integrated circuit (IC) having an improved alignment structure (e.g., alignment mark). As mentioned above, during a formation of a die or chip in an IC, an array of dies mounted to a wafer (e.g., silicon) undergo a singulation process to separate the dies from each other for further processing. During a photolithography process, alignment marks are patterned along selected scribe lines on one or more metal layers of the wafer between adjacent dies in both an X and Y direction for alignment purposes during the fabrication process of the wafer. The alignment marks are required to build the pattern layers of the IC and are thus a key component in the fabrication process. During the singulation process, however, the alignment marks create separation issues along the selected scribe lines between the respective adjacent dies where the alignment marks are greater than 300 μm long. Thus, the improved alignment marks disclosed herein include at least one separated or split layer that facilitates separation along the selected scribe lines.

Figure 1:
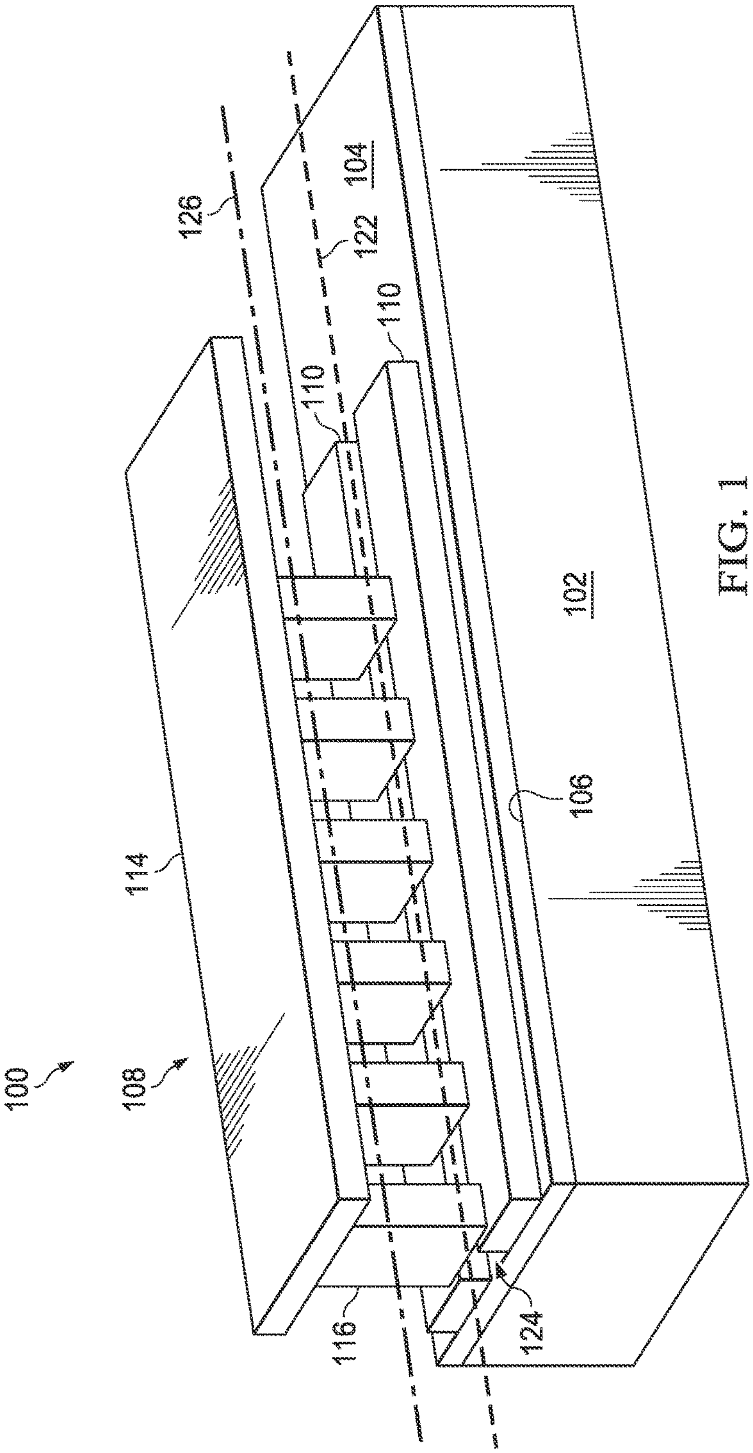
FIG. 1 is a perspective view of an example electronic device having an improved alignment mark.
Figure 2A:
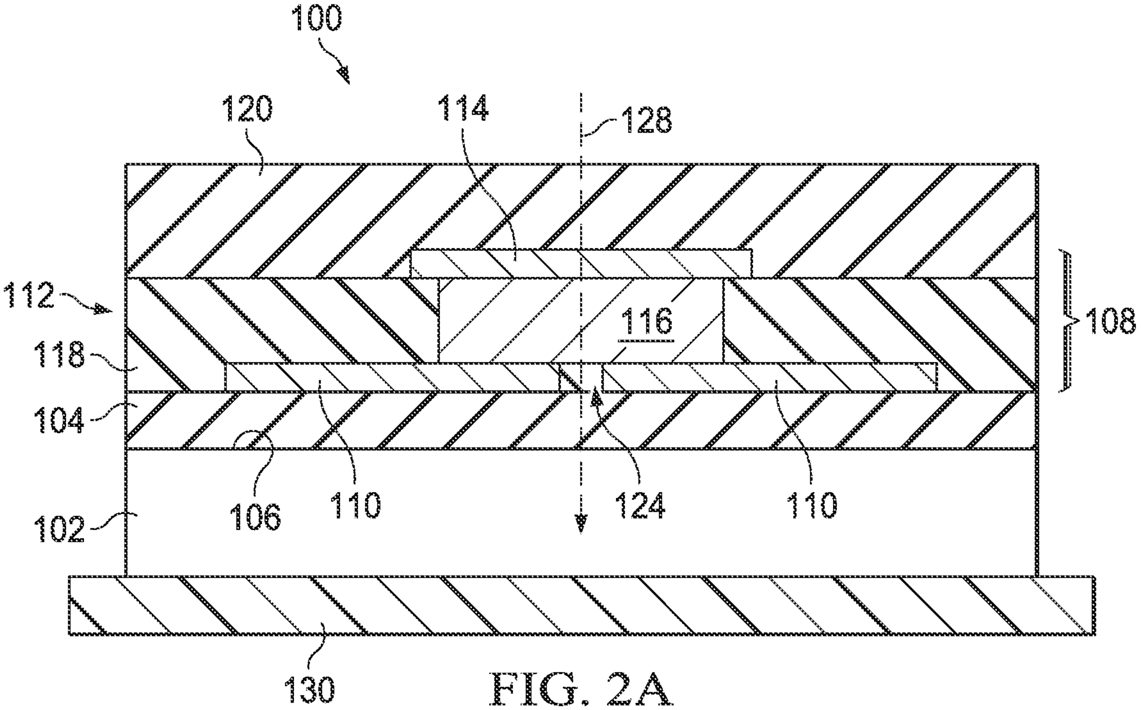
FIG. 2A is a side view of the example electronic device of FIG. 1 having an improved alignment mark.

FIG. 1 is a perspective view and FIG. 2A is a side view of an example electronic device 100 (e.g., photo alignment structure) comprised of a wafer (e.g., silicon) 102 having an oxide layer 104 disposed on a top planar surface 106 of the wafer 102. The electronic device 100 further includes an alignment structure (e.g., alignment mark) 108 disposed on the oxide layer 104. The alignment structure 108 is a multi-layered structure comprised of a first metal (e.g., aluminum) layer 110 disposed on the oxide layer 104, a second metal layer 112 (see FIG. 2A) disposed on the first metal layer 110, and a third metal (e.g., aluminum) layer 114 disposed on the second metal layer 112. The second metal layer 112 is comprised of metal (e.g., tungsten) filled vias 116 defined in a dielectric layer 118. A protective passivation layer (e.g., oxide) 120 is disposed on the alignment structure 108 for protective purposes during transport of the electronic device 100 for further processing.

Figure 2B:
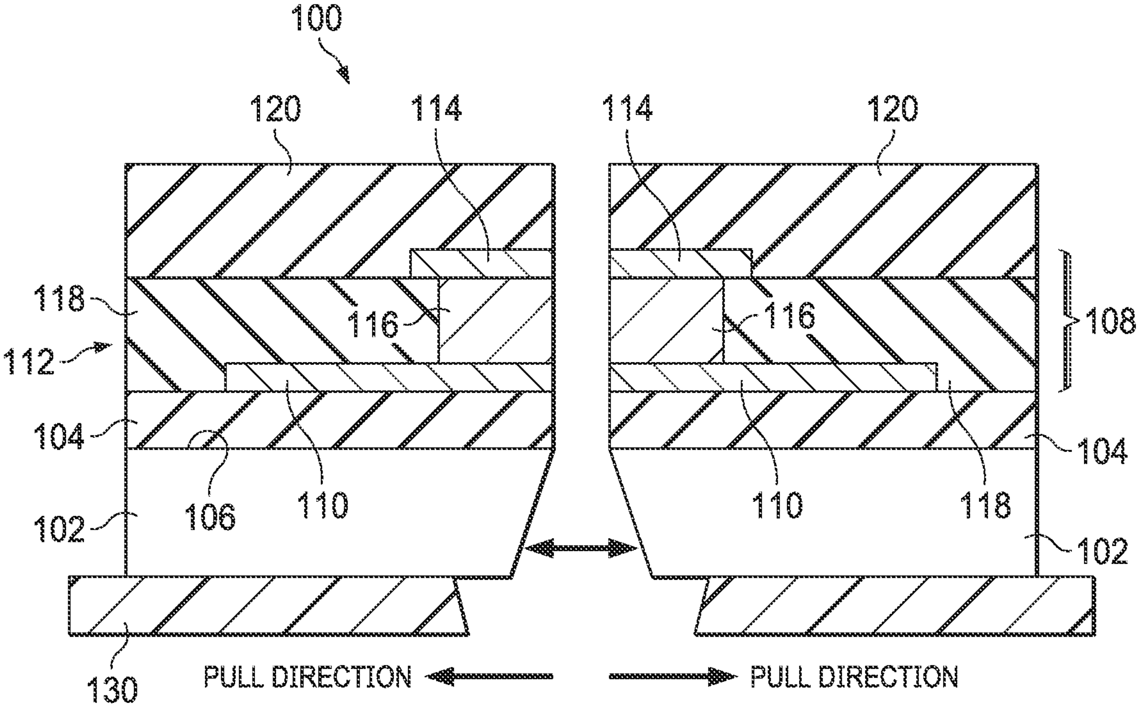
FIG. 2B is a side view of the example electronic device of FIGS. 1 and 2A after a singulation process.

The alignment structure 108 is positioned on a portion of selected scribe lines 122 defined on the wafer 102. The alignment structure 108 may have a width of approximately 35-80 μm and a length up to 850 μm. The scribe line 122 is a location where the wafer 102 is separated during the singulation process. In the example in FIGS. 1 and 2A, a slot 124 is defined in the first metal layer 110 in a direction corresponding to a longitudinal axis 126 of the alignment structure 108 and along the scribe line 122. Thus, the first metal layer 110 is divided into a two adjacent metal layers along the scribe line 122. The slot 124 facilitates separation of the wafer 102 during the singulation process. Specifically, as will be described in more detail below, during the singulation process a cutting device (e.g., laser) represented by the arrow 128 is focused down to an approximate center of the wafer 102 to initially separate the wafer 102 along the scribe line 122. The wafer 102 is then pulled with tape 130 that is attached to a bottom surface of the wafer 102 in every radial direction (0-360°) as indicated by the arrows to separate the wafer 102 along the scribe line 122 whereupon the wafer 102 easily separates, as illustrated in FIG. 2B.

Figure 3A:
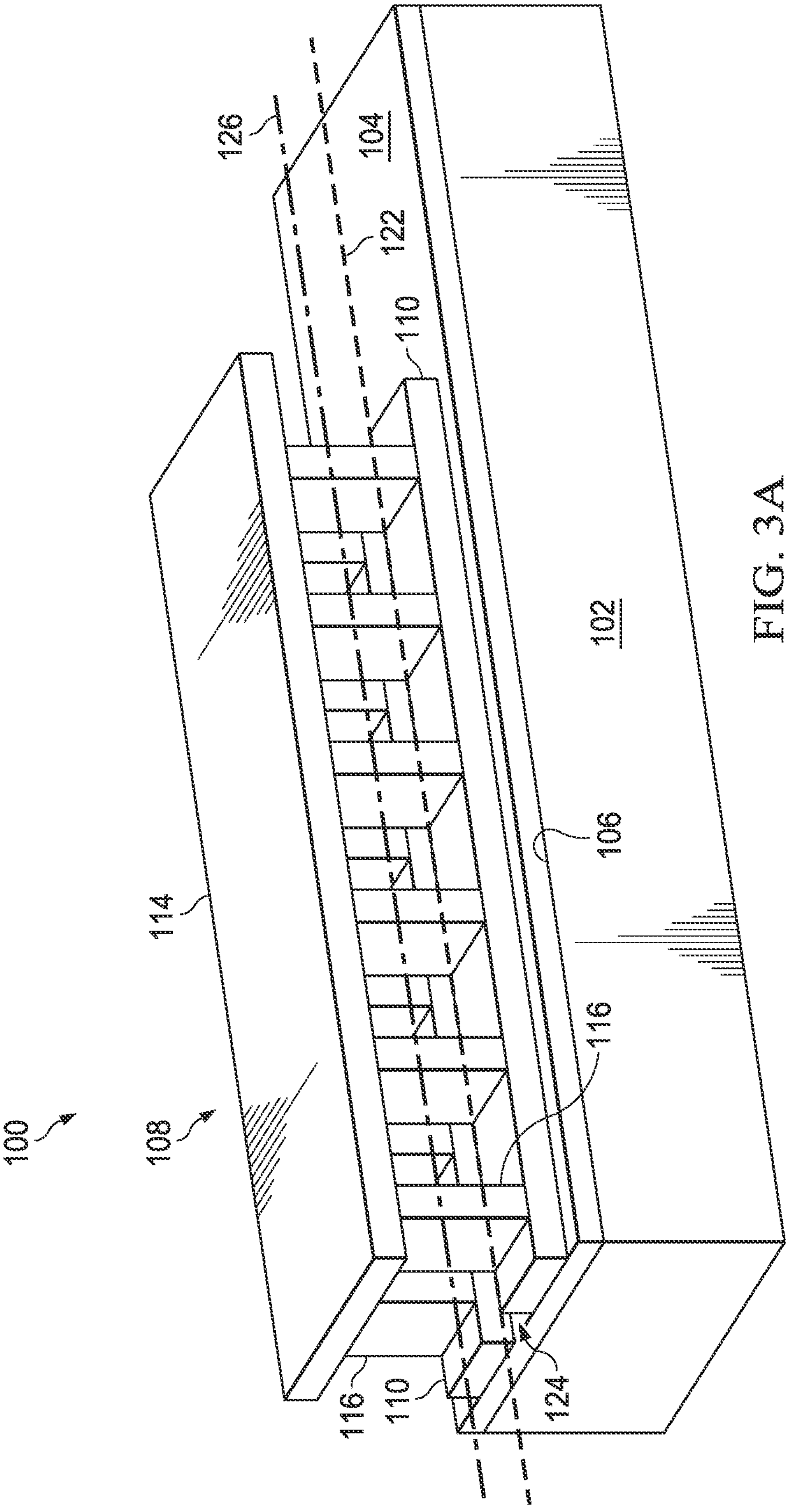
FIGS. 3A and 3B are perspective view of other examples of an electronic device having an improved alignment mark.
Figure 3B:
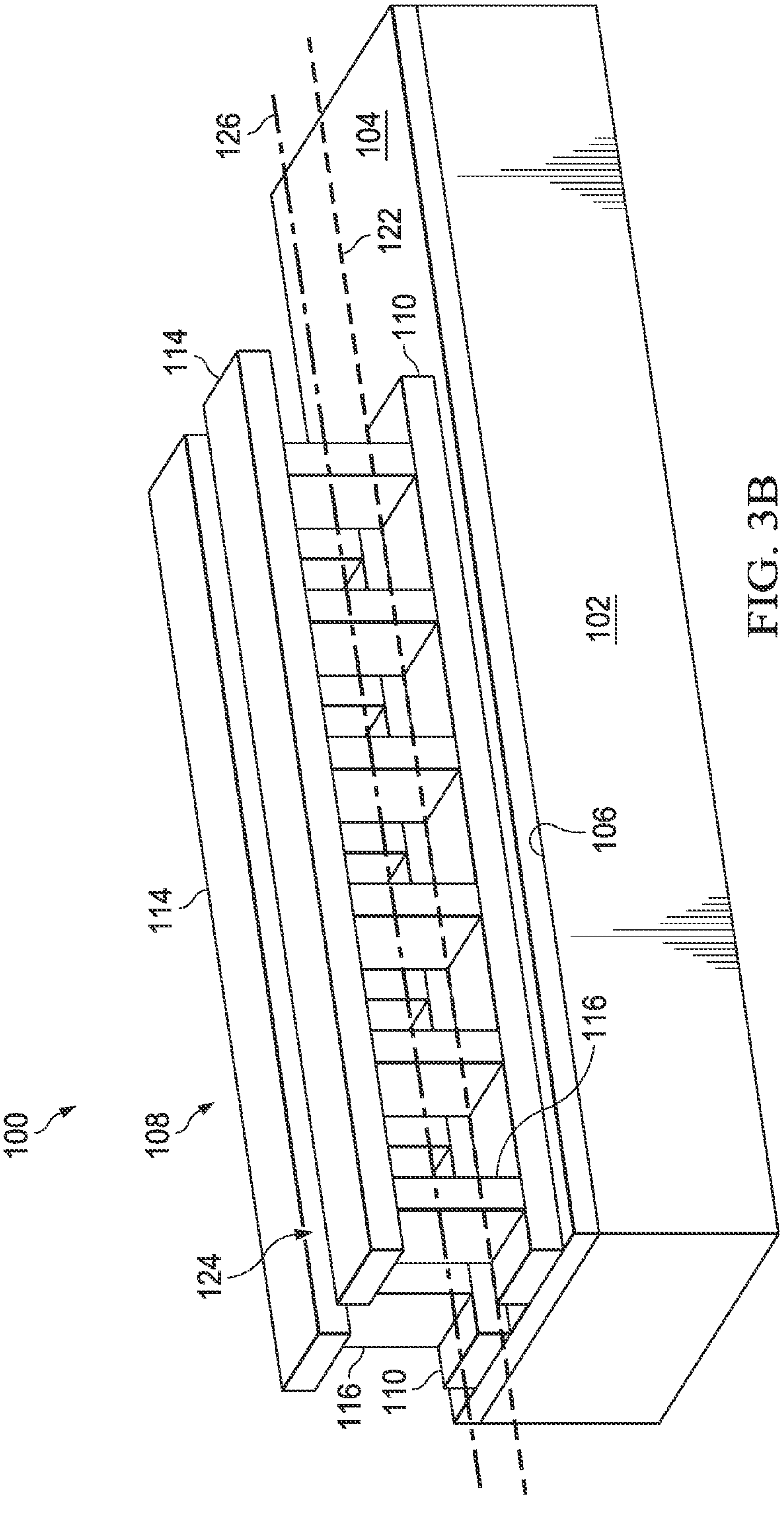

In other examples illustrated in FIGS. 3A and 3B where like reference numerals represent the same or similar features, the slot 124 in the alignment structure 108 can be further defined in the second metal layer 112 (i.e., the metal filled vias 116) and/or the third metal layer, 114. For example, as illustrated in the example in FIG. 3A, the slot 124 is defined in both the first metal layer 110 and the second metal layer 112. Thus, in this example, the first metal layer 110 is divided into a two adjacent metal layers along the scribe line 122 and each of the metal filled vias 116 are divided into a pair of adjacent vias along the scribe line 122. Similarly, as illustrated in the example in FIG. 3B, the slot 124 is defined in the first metal layer 110, the second metal layer 112 (i.e., the metal filled vias 116), and the third metal layer 114. Thus, in this example, the first metal layer 110 is divided into a two adjacent metal layers along the scribe line 122, each of the metal filled vias 116 are divided into a pair of adjacent vias along the scribe line 122, and the third metal layer 114 is divided into a two adjacent metal layers along the scribe line 122. Each of the illustrated examples in FIGS. 1, 3A, and 3B provides an improvement in the fabrication of IC's in that the addition of the slot 124 in the alignment structures 108 solves the issue of separation difficulties during the singulation process.

Figure 4:
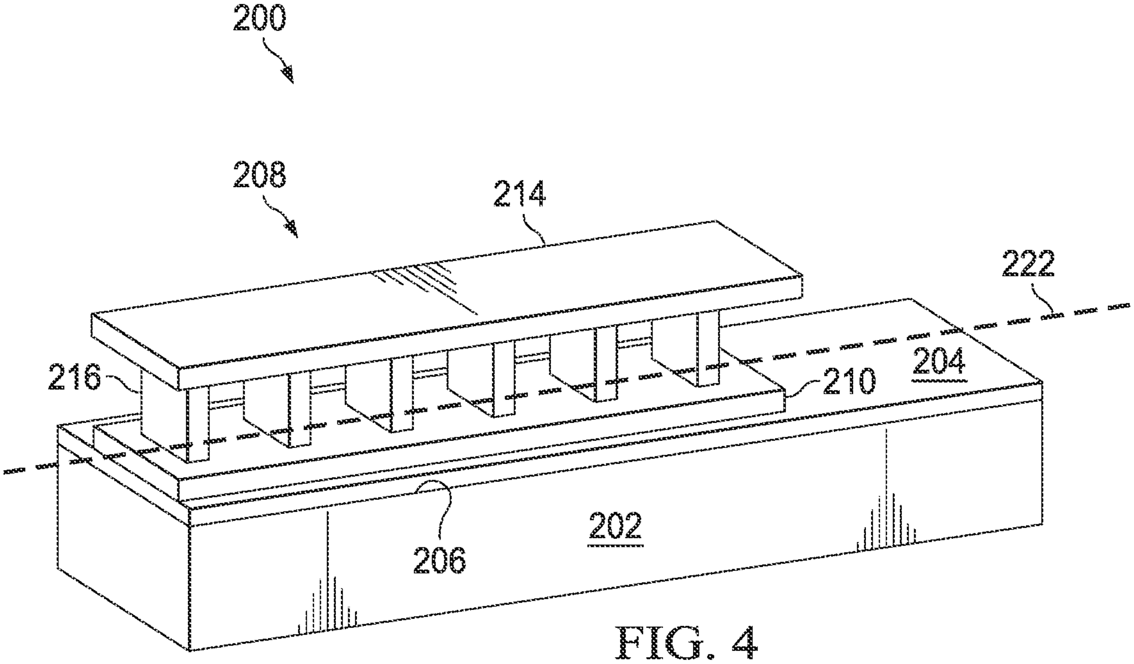
FIG. 4 is a perspective view of an example electronic device not having an improved alignment mark.
Figure 5A:
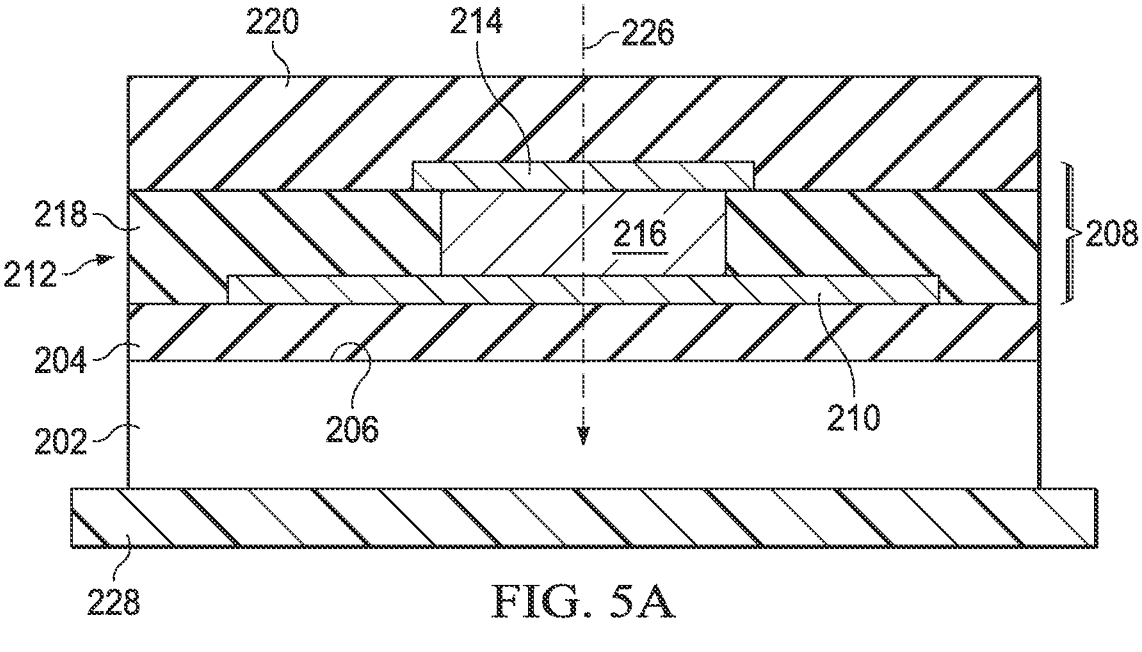
FIGS. 5A-5C are side views of the example electronic device of FIG. 4 not having the improved alignment mark.

Conversely, in the example illustrated in FIGS. 4 and 5A-5C, the alignment mark does not include a slot and thus, the wafer is not easily separated thereby decreasing the die yield. Specifically, FIG. 4 is a perspective view and FIG. 5A is a side view of an example electronic device 200 (e.g., photo alignment structure) comprised of a wafer (e.g., silicon) 202 having an oxide layer 204 disposed on a top planar surface 206 of the wafer 202. The electronic device 200 further includes an alignment mark 208 disposed on the oxide layer 204. The alignment mark 208 is a multi-layered structure comprised of a first metal (e.g., aluminum) layer 210 disposed on the oxide layer 204, a second metal layer 212 disposed on the first metal layer 210, and a third metal (e.g., aluminum) layer 214 disposed on the second metal layer 212. The second metal layer 212 is comprised of metal (e.g., tungsten) filled vias 216 defined in a dielectric layer 218. A protective passivation layer (e.g., oxide) 220 is disposed on the alignment mark 208 for protective purposes during transport of the electronic device 200 for further processing.

Figure 5B:
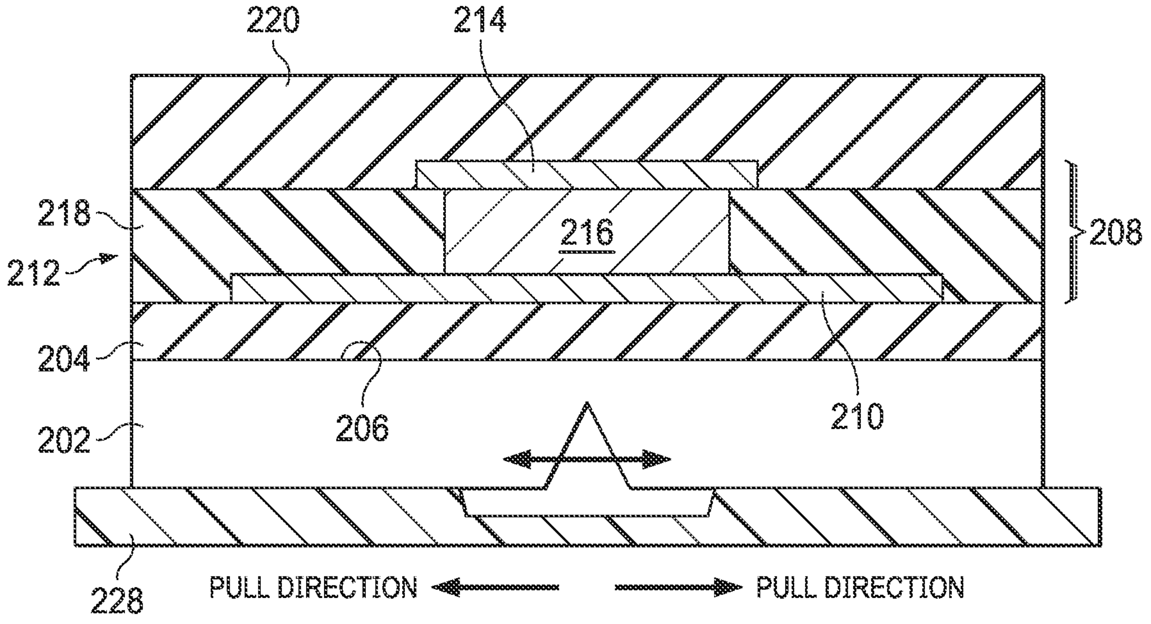
Figure 5C:
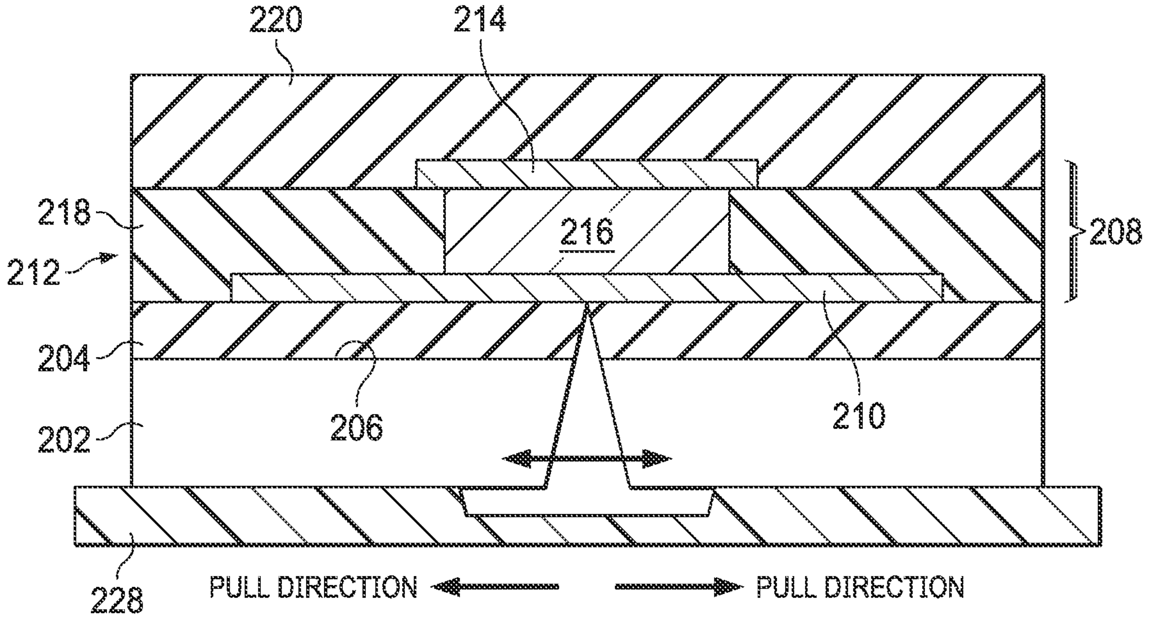

The alignment mark 208 is positioned on a scribe line 222 defined on the wafer 202. As mentioned above, the scribe line 222 is a location where the wafer 202 is separated during the singulation process. During the singulation process a cutting device (e.g., laser) represented by the arrow 226 is focused down to an approximate center of the wafer 202 to initially separate the wafer 202 along the scribe line 222. The wafer 202 is then pulled with tape 228 that is attached to a bottom surface of the wafer 202 in every radial direction (0-360°) as indicated by the arrows to separate the wafer 202 along the scribe line 222. As illustrated in FIGS. 5B and 5C, however, as the separation progresses toward the alignment mark 208, the first metal layer 210 inhibits separation. As a result, the wafer 202 does not fully separate and the respective dies on either side of the scribe line are un-useable.

FIGS. 6-24 illustrate a fabricating process of an electronic device (e.g., photo alignment structure) in connection with the electronic device 100 illustrated in FIG. 1. Though depicted sequentially as a matter of convenience, at least some of the actions shown can be performed in a different order and/or performed in parallel. Alternatively, some implementations may perform only some of the actions shown. Still further, although the example illustrated in FIGS. 6-24 is an example method illustrating the example configuration of FIG. 1, other methods and configurations are possible, such as the example configurations illustrated in FIGS. 3A and 3B. In addition, the fabricating process illustrated in FIGS. 6-24 illustrates the fabrication of an alignment structure (e.g., alignment mark) during a photo lithography process. The fabrication process, however, applies to all the alignment marks deposited along selected scribe lines of one or more metal layers of the wafer between adjacent dies in both an X and Y direction.

Figure 6:
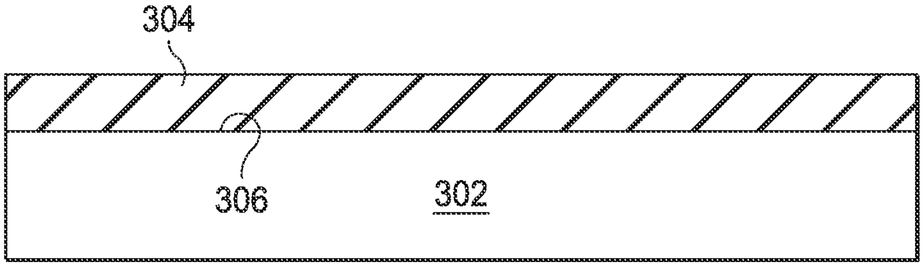
FIG. 6 is a schematic cross-section view of a wafer of the electronic device of FIG. 1 in the early stages of fabrication.
Figure 7:
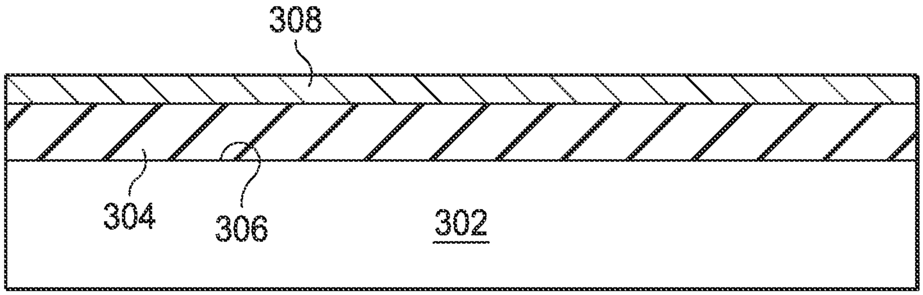
FIG. 7 is a schematic cross-section view of the wafer of FIG. 6 after undergoing a deposition of a metal layer.
Figure 8:
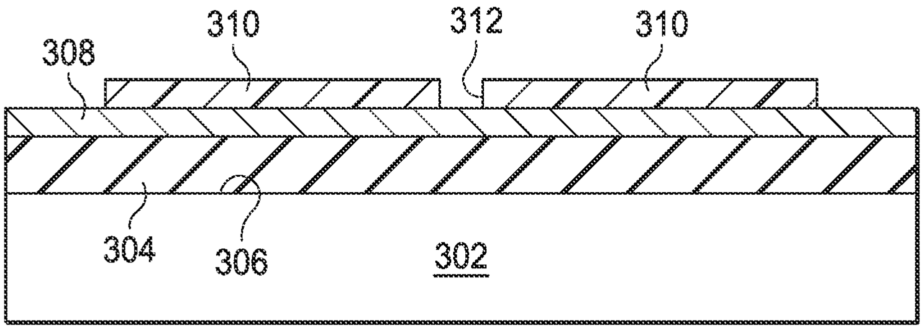
FIG. 8 is a schematic cross-section view of the wafer of FIG. 7 after undergoing a deposition and pattern development of a photoresist material layer on the metal layer.

Referring to FIG. 6, the fabricating process begins with a wafer (e.g., silicon) 302 that includes an oxide layer 304 disposed on a top planar surface 306 of the wafer 302, via a thermal oxidation (e.g., dry oxidation, wet oxidation) process. A first metal layer (e.g., aluminum) 308 is deposited on the oxide layer 304 via a sputtering process or other deposition process, see FIG. 7. The first metal layer 308 is the first metal layer of the alignment structure. Referring to FIG. 8, a first photoresist material layer 310 is deposited on a surface of the first metal layer 308. The first photoresist material layer 310 is patterned and developed to expose an opening 312 in the first photoresist material layer 310, thereby exposing portions of the first metal layer 308 within the opening 312. The first photoresist material layer 310 can have a thickness that varies in correspondence with the wavelength of radiation used to pattern the photoresist material layer 310. The first photoresist material layer 310 may be formed over the first metal layer 308 via spin-coating or spin casting deposition techniques, selectively irradiated (e.g., via deep ultraviolet (DUV) irradiation) and developed to form the opening 312.

Figure 9:
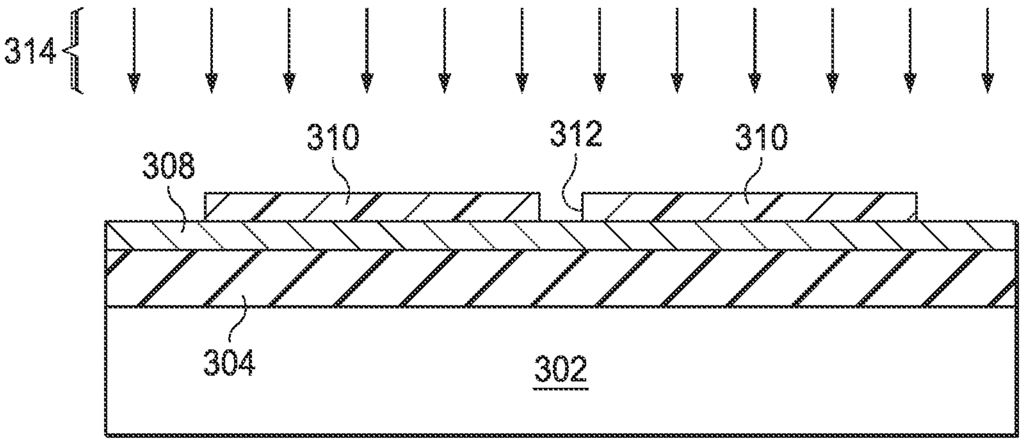
FIG. 9 is a schematic cross-section view of the wafer of FIG. 8 undergoing an etch process to etch exposed portions of the metal layer not covered by the photoresist material layer.
Figure 10:
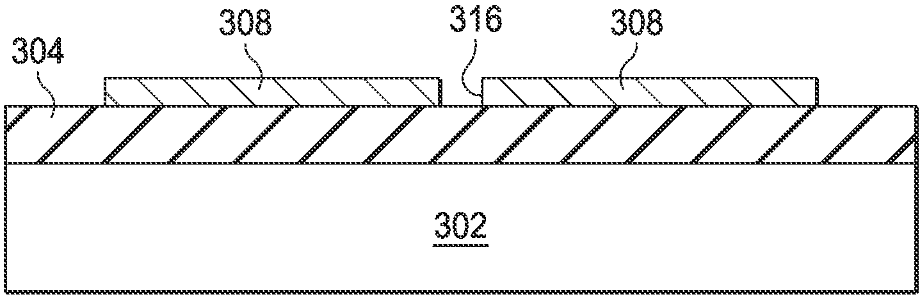
FIG. 10 is a schematic cross-section view of the wafer of FIG. 9 after undergoing the etch process to remove exposed portions of the metal layer and the photoresist material layer.
Figure 11:
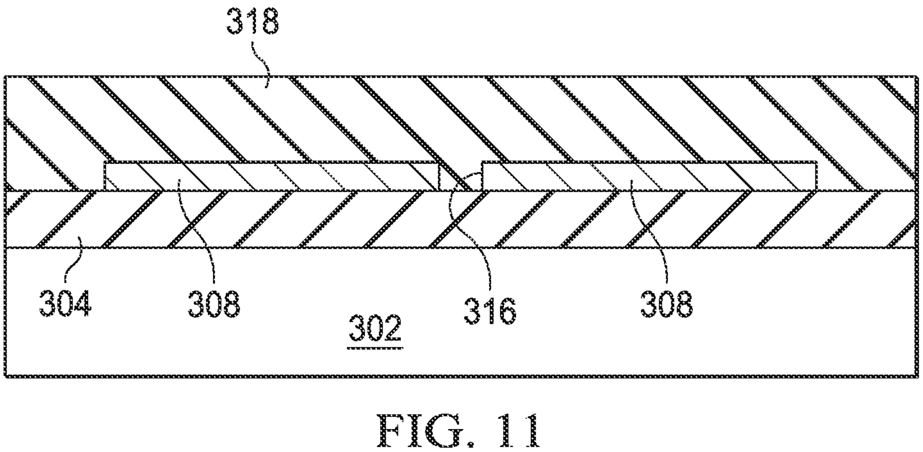
FIG. 11 is a schematic cross-section view of the wafer of FIG. 10 after undergoing a deposition of a dielectric layer on the metal layer.
Figure 12:
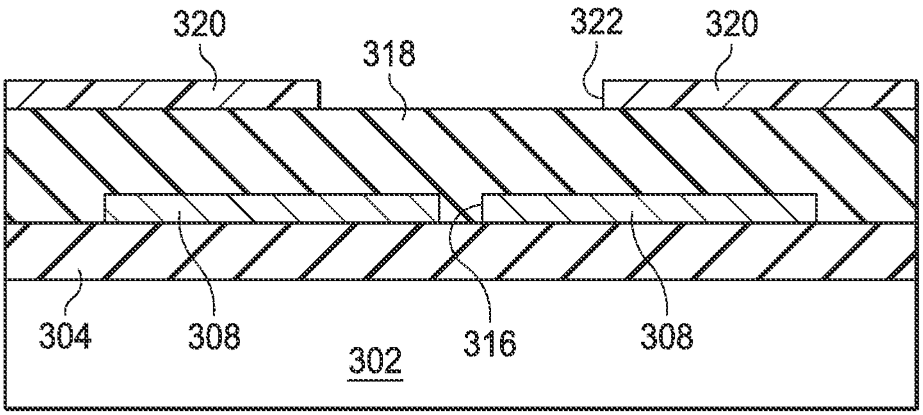
FIG. 12 is a schematic cross-section view of the wafer of FIG. 11 after undergoing a deposition and pattern development of a photoresist material layer on the dielectric layer.

Referring to FIG. 9, a metal etching process 314 removes the exposed portions of the first metal layer 308 thereby forming a slot 316 defined in the first metal layer 308 in a direction corresponding to a longitudinal direction of the alignment structure and a subsequent process removes the first photoresist material layer 310 resulting in the configuration illustrated in FIG. 10. As described above, the slot 316 runs along scribe lines defined on the wafer 302. A dielectric (metal oxide) layer 318 is formed over the first metal layer 308 via a deposition process, see FIG. 11. Referring to FIG. 12, a second photoresist material layer 320 is deposited on a surface of the dielectric layer 318. The second photoresist material layer 320 is patterned and developed to expose an opening 322 in the second photoresist material layer 320, thereby exposing portions of the dielectric layer 318 within the opening 322. The second photoresist material layer 320 may be formed over the dielectric layer 318 via spin-coating or spin casting deposition techniques, selectively irradiated (e.g., via deep ultraviolet (DUV) irradiation) and developed to form the opening 322.

Figure 13:
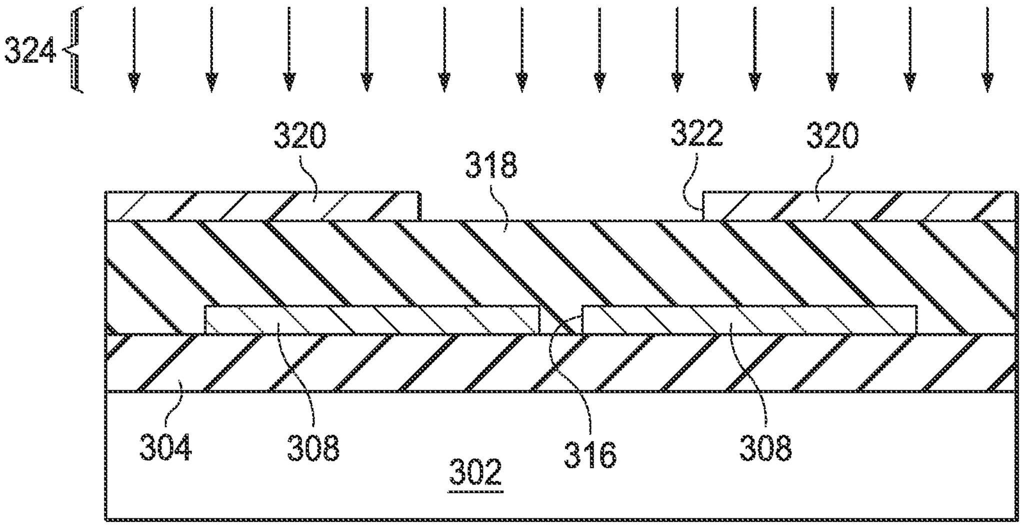
FIG. 13 is a schematic cross-section view of the wafer of FIG. 12 undergoing an etch process to etch exposed portions of the dielectric layer not covered by the photoresist material layer.
Figure 14:
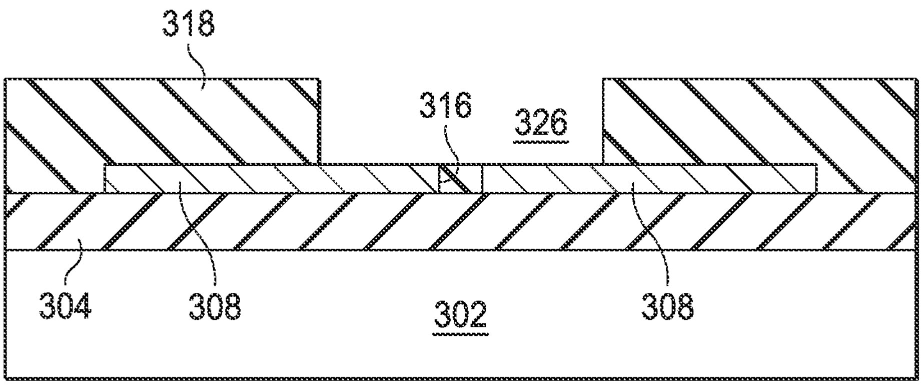
FIG. 14 is a schematic cross-section view of the wafer of FIG. 13 after undergoing the etch process to remove exposed portions of the dielectric layer and the photoresist material layer thereby forming a via in the dielectric layer.
Figure 15:
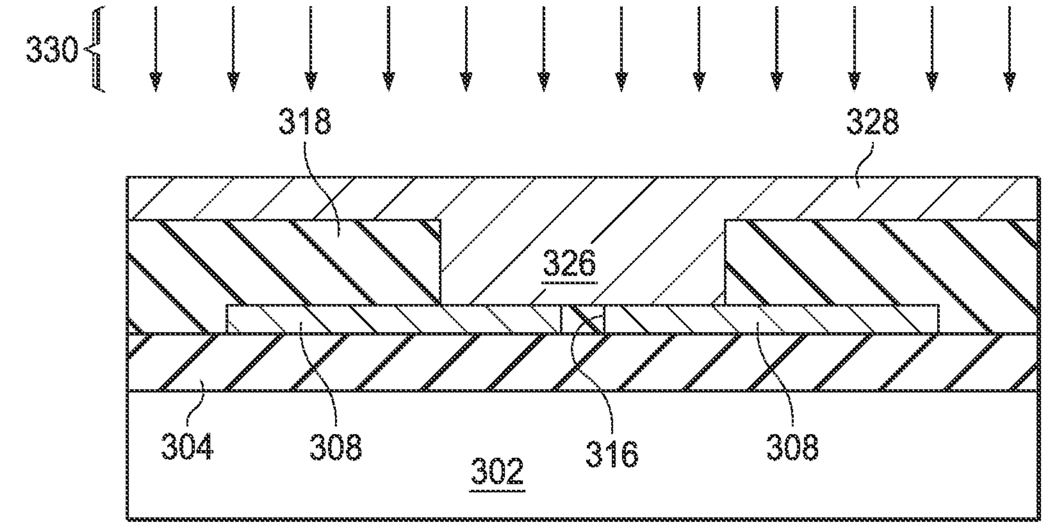
FIG. 15 is a schematic cross-section view of the wafer of FIG. 14 after undergoing a deposition of a metal layer on the dielectric layer and in the via in the dielectric layer.
Figure 16:
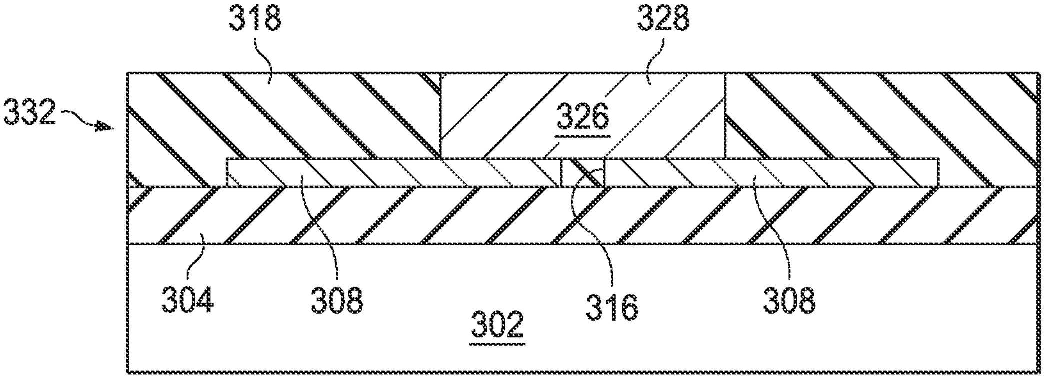
FIG. 16 is a schematic cross-section view of the wafer of FIG. 15 after undergoing a polishing process to remove the metal layer deposited on the dielectric layer.
Figure 17:
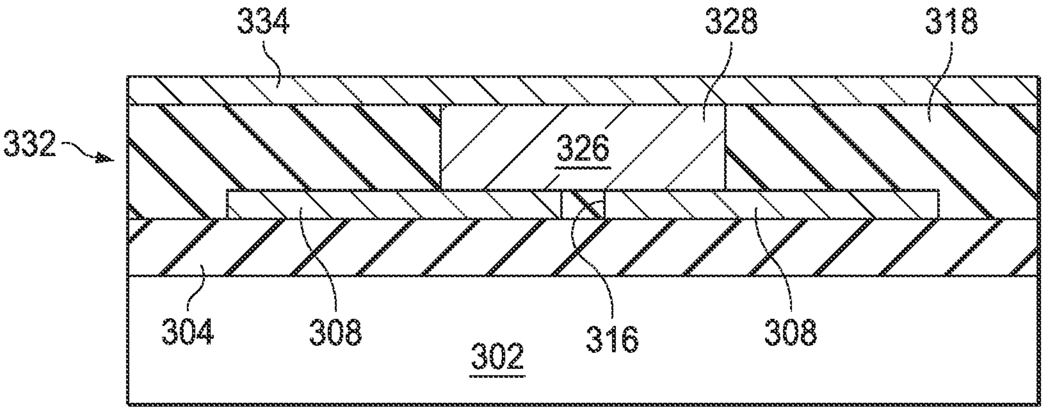
FIG. 17 is a schematic cross-section view of the wafer of FIG. 16 after undergoing a deposition of a metal layer on the dielectric layer and on the via in the dielectric layer.

Referring to FIG. 13, an etching process 324 removes the exposed portions of the dielectric layer 318 thereby forming a via 326 defined in the dielectric layer 318 and a subsequent process removes the second photoresist material layer 320 resulting in the configuration illustrated in FIG. 14. Referring to FIG. 15, a metal (e.g., tungsten) film 328 is deposited on a surface of the dielectric layer 318. The metal (e.g., tungsten) film is also deposited in the via 326 thereby filling the via 326. Still referring to FIG. 15, a polishing process 330 is performed to remove the metal film 328 from the surface of the dielectric layer 318, while leaving a portion of the metal film 328 in the via 326, resulting in the configuration in FIG. 16. The formation of the dielectric layer 318 and the metal (e.g., tungsten) filled via 326 form the second metal layer 332 of the alignment structure. A third metal layer 334 is deposited on the second metal layer 332 via a sputtering process or other deposition process, see FIG. 17.

Figure 18:
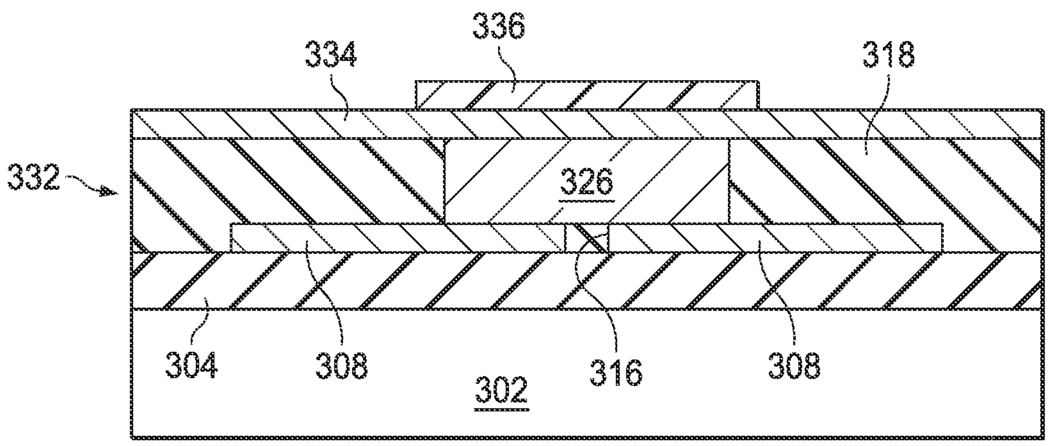
FIG. 18 is a schematic cross-section view of the wafer of FIG. 17 after undergoing a deposition and pattern development of a photoresist material layer on the metal layer.
Figure 19:
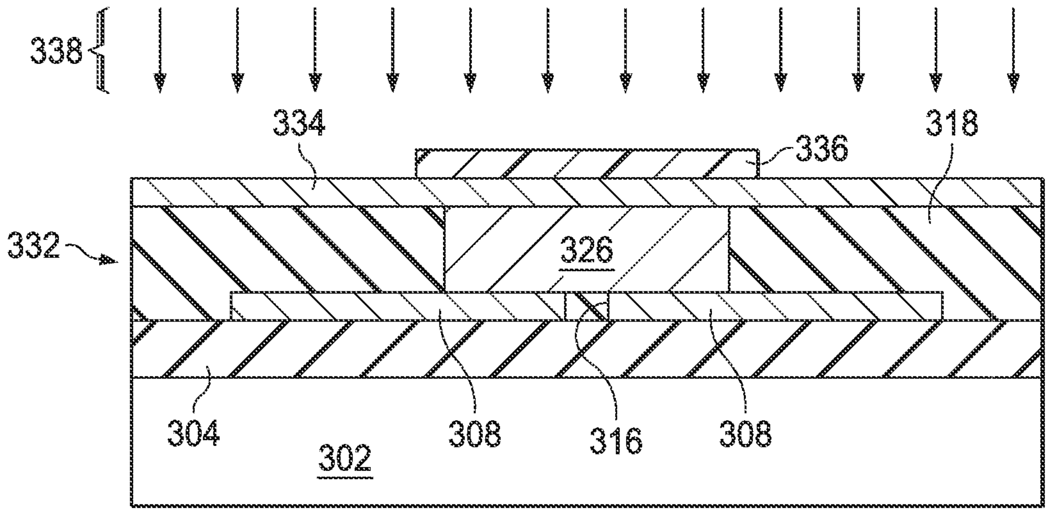
FIG. 19 is a schematic cross-section view of the wafer of FIG. 18 undergoing an etch process to etch exposed portions of the metal layer not covered by the photoresist material layer.
Figure 20:
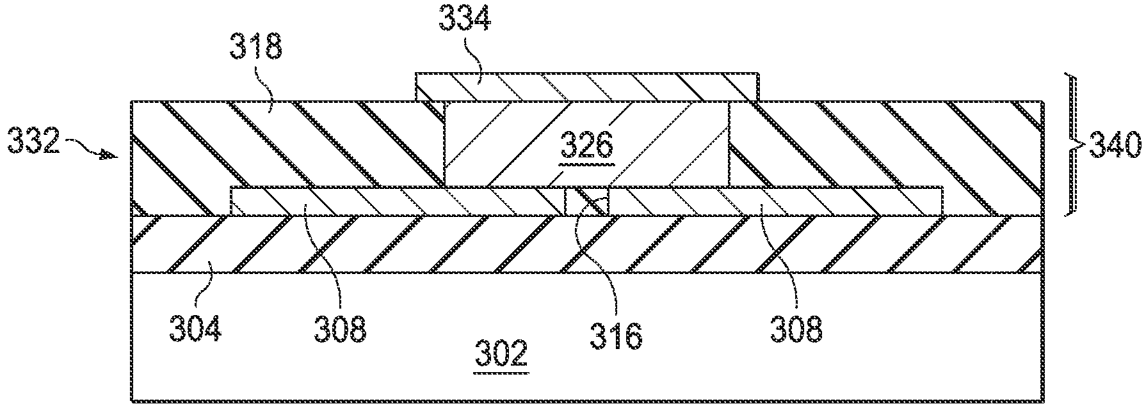
FIG. 20 is a schematic cross-section view of the wafer in FIG. 19 after undergoing the etch process to remove exposed portions of the metal layer and the photoresist material layer.
Figure 21:
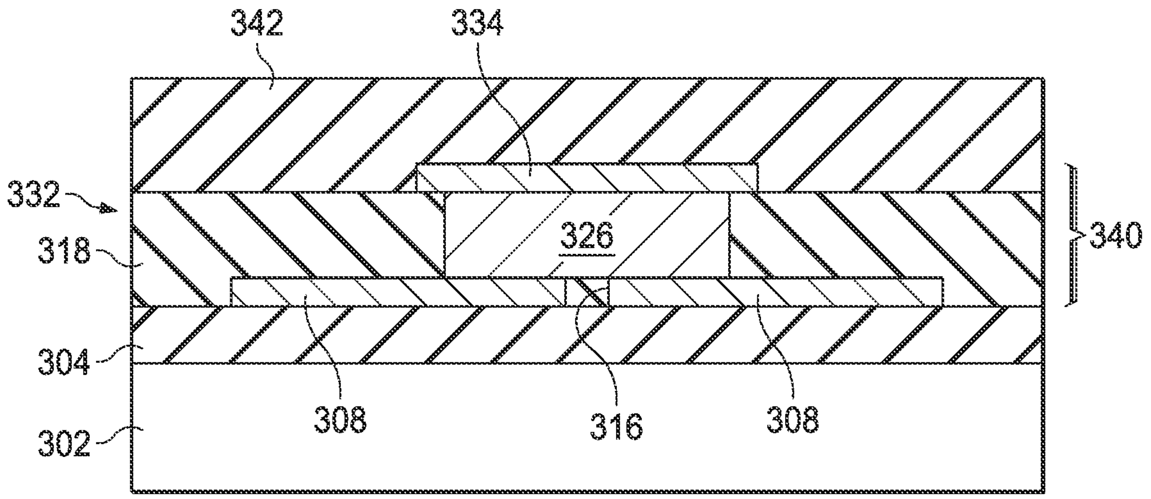
FIG. 21 is a schematic cross-section view of the wafer of FIG. 20 after undergoing a deposition of a protective oxide layer on the metal layer.
Figure 22:
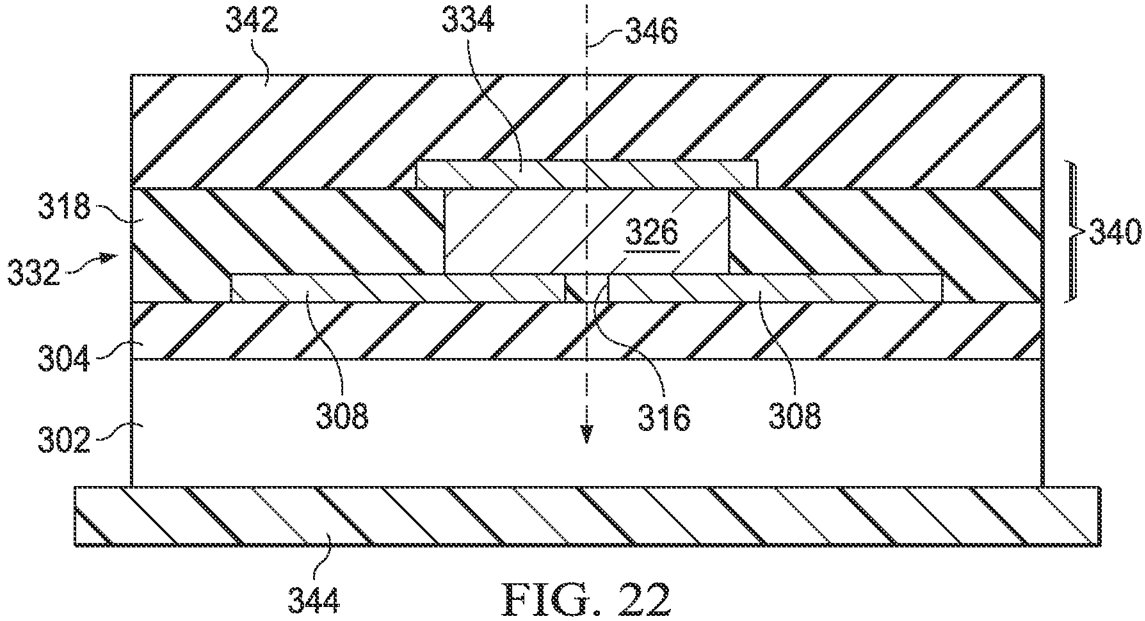
FIG. 22 is a schematic cross-section view of the wafer of FIG. 21 illustrating a laser initiating a separation of the wafer.

Referring to FIG. 18, a third photoresist material layer 336 is deposited on a surface of the third metal layer 334. The third photoresist material layer 336 is patterned and developed to align with the via 326 in the second metal layer 332 thus exposing portions of the third metal layer 334. The third photoresist material layer 336 may be formed over the third metal layer 334 via spin-coating or spin casting deposition techniques, selectively irradiated (e.g., via deep ultraviolet (DUV) irradiation) and developed to expose portions of the third metal layer 334. Referring to FIG. 19, an etching process 338 removes the exposed portions of the third metal layer 334 thereby forming a metal layer primarily over the vias 326 in the second metal layer 332 and a subsequent process removes the third photoresist material layer 336 resulting in the configuration illustrated in FIG. 20. The resulting configuration of the first, second and third metal layers 308, 332, 334 form the alignment structure 340. Referring to FIG. 21, a protective passivation layer (e.g., oxide) 342 is disposed on the alignment structure 340 for protective purposes during transport of the electronic device for further processing.

Figure 23:
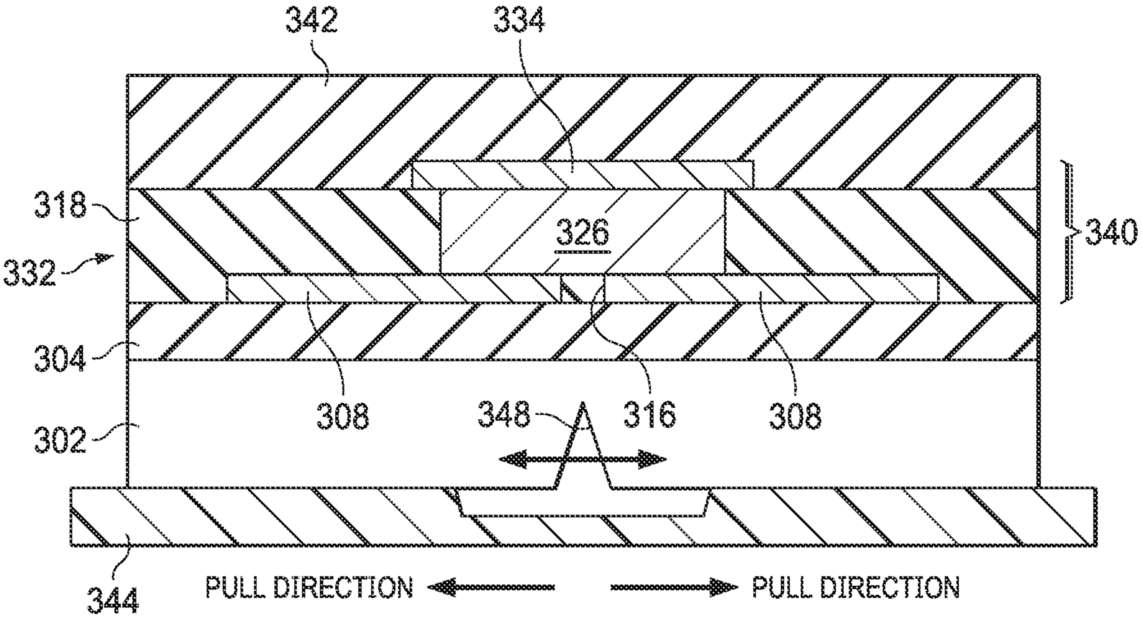
FIG. 23 is a schematic cross-section view of the wafer of FIG. 22 in the initial separation stage.
Figure 24:
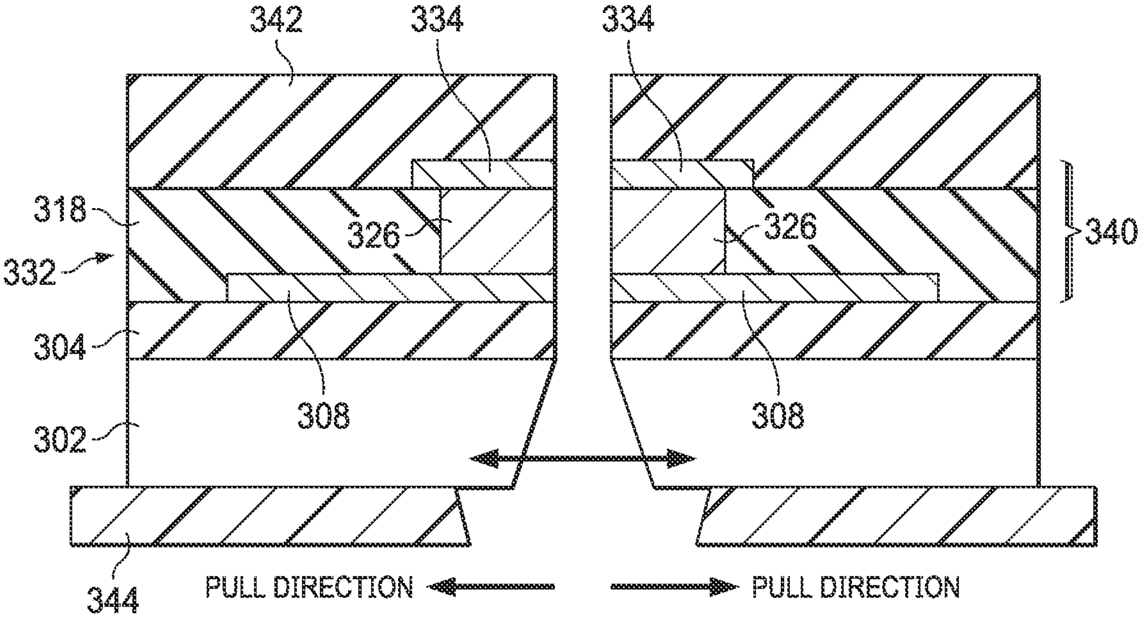
FIG. 24 is a schematic cross-section view of the wafer in FIG. 23 in the final separation stage.

As mentioned above, the slot 316 defined in the first metal layer 308 facilitates separation of the wafer 302 during the singulation process. Specifically, referring to FIG. 22, during the singulation process tape 344 is attached to a back surface of the wafer 302 and a cutting device (e.g., laser) represented by the arrow 346 is focused down to an approximate center of the wafer 302. The laser 346 provides an initial separation 348 of the wafer 302 along the scribe line, as illustrated in FIG. 23. The tape 344, with the wafer 302 attached, is pulled in every radial direction (0-360°) as indicated by the arrows to fully separate the wafer 302 along the scribe line whereupon the wafer 302 easily separates, as illustrated in FIG. 24.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean based at least in part.

What is claimed is:

1. A method of fabricating an electronic device comprising:

providing a wafer having scribe lines defined therein;

depositing an alignment structure having a plurality of metal layers on a top planar surface of the wafer longitudinally aligned with a portion of selected scribe lines, wherein the depositing includes depositing a first metal layer on the top planar surface of the wafer, depositing a second metal layer on the first metal layer, and depositing a third metal layer on the second metal layer; and etching a slot in a longitudinal direction of the alignment structures in the first and the second metal layers of the alignment structure along the portion of the selected scribe lines.

2. The method of claim 1, further comprising etching the slot in the third metal layer.

3. The method of claim 1, further comprising attaching the wafer to tape and pulling the tape in every radial direction to separate the wafer along the scribe lines.

4. A method of fabricating an electronic device comprising:

providing a wafer having scribe lines defined therein;

depositing an alignment structure having a plurality of metal layers on a top planar surface of the wafer longitudinally aligned with a portion of selected scribe lines, wherein the depositing includes depositing a first metal layer on the top planar surface of the wafer, depositing a second metal layer on the first metal layer, and depositing a third metal layer on the second metal layer;

etching a slot in a longitudinal direction of the alignment structure in at least one of the plurality of metal layers of the alignment structure along the portion of the selected scribe lines; and polishing the surface of the dielectric layer to remove the metal film from the surface of the dielectric layer.

5. The method of claim 4, further comprising etching the slot in the second metal layer.

6. The method of claim 5, wherein depositing the third metal layer on the second metal layer includes depositing a photoresist material layer on a portion of the second metal layer aligned with the via defined in the dielectric layer, and removing portions of the third metal layer via an etching process not aligned with the via.

7. The method of claim 6, further comprising etching the slot in the third metal layer.

8. A method of fabricating a photo alignment structure comprising:

providing a wafer having scribe lines defined therein;

depositing a first metal layer of an alignment structure on a top surface of the wafer, the first metal layer being disposed over a portion of selected scribe lines;

depositing a second metal layer on the first metal layer, the second metal layer comprising a dielectric layer having vias defined therein, the vias filled with a metal;

depositing a third metal layer on the second metal layer; and etching a slot in a longitudinal direction in at least two of the first metal layer, the second metal layer, and the third metal layer.

9. The method of claim 8, further comprising attaching the wafer to tape and pulling the tape in every radial direction to separate the wafer along the scribe lines.

10. A method of fabricating a photo alignment structure comprising:

providing a wafer having scribe lines defined therein;

depositing a first metal layer of an alignment structure on a top surface of the wafer, the first metal layer being disposed over a portion of selected scribe lines;

depositing a second metal layer on the first metal layer, the second metal layer comprising a dielectric layer having vias defined therein, the vias filled with a metal;

depositing a third metal layer on the second metal layer;

etching a slot in a longitudinal direction of one of the first metal layer, the second metal layer, and the third metal layer along the portion of the selected scribe lines; and etching a slot in the longitudinal direction in the first metal layer, the second metal layer, and the third metal layer.

11. A method of fabricating a photo alignment structure comprising:

providing a wafer having scribe lines defined therein;

depositing a first metal layer of an alignment structure on a top surface of the wafer, the first metal layer being disposed over a portion of selected scribe lines;

depositing a second metal layer on the first metal layer, the second metal layer comprising a dielectric layer having vias defined therein, the vias filled with a metal, wherein depositing the second metal layer on the first metal layer includes depositing the dielectric layer on the first metal layer, etching at least one via in the dielectric layer, depositing a metal film on a surface of the dielectric layer, depositing the metal film in the at least one via to fill the at least one via, and polishing the surface of the dielectric layer to remove the metal film from the surface of the dielectric layer;

depositing a third metal layer on the second metal layer; and etching a slot in a longitudinal direction of one of the first metal layer, the second metal layer, and the third metal layer along the portion of the selected scribe lines.

12. A method of fabricating a photo alignment structure comprising:

providing a wafer having scribe lines defined therein;

depositing a first metal layer of an alignment structure on a top surface of the wafer, the first metal layer being disposed over a portion of selected scribe lines;

depositing a second metal layer on the first metal layer, the second metal layer comprising a dielectric layer having vias defined therein, the vias filled with a metal;

depositing a third metal layer on the second metal layer, wherein depositing the third metal layer on the second metal layer includes depositing a photoresist material layer on a portion of the second metal layer aligned with the via defined in the dielectric layer, and removing portions of the third metal layer via an etching process not aligned with the via; and etching a slot in a longitudinal direction of one of the first metal layer, the second metal layer, and the third metal layer along the portion of the selected scribe lines.

* * * * *